United States Patent [19]
Lyons et al.

[11] Patent Number: 5,867,536
[45] Date of Patent: Feb. 2, 1999

[54] DIGITAL SYNCHRONIZATION OF BROADCAST FREQUENCY

[75] Inventors: Christopher T. Lyons, Tyngsboro; Ismail Taskin, Arlington, both of Mass.

[73] Assignee: Hittite Microwave Corporation, Woburn, Mass.

[21] Appl. No.: 798,651

[22] Filed: Feb. 11, 1997

[51] Int. Cl.$^6$ ................................................. H04L 27/04
[52] U.S. Cl. ........................................ 375/295; 332/126
[58] Field of Search .................................. 375/295, 373, 375/376, 296; 332/118, 126

[56] References Cited

U.S. PATENT DOCUMENTS

| | | | |
|---|---|---|---|
| 4,573,017 | 2/1986 | Levine | 328/155 |
| 4,816,781 | 3/1989 | Marz | 332/124 |
| 5,703,539 | 12/1997 | Gillig et al. | 331/16 |

*Primary Examiner*—Tesfaldet Bocure
*Attorney, Agent, or Firm*—Iandiorio & Teska

[57] ABSTRACT

A dynamic, self adjusting synchronization system for real time control of the frequency and bandwidth of a modulated signal includes a voltage controlled oscillator for generating a carrier signal to be modulated having a predetermined frequency and bandwidth. There is an adjustment device having a center frequency adjustment circuit for providing a voltage level to the voltage controlled oscillator. A modulation generator generates a modulation signal for modulating the carrier signal to produce a modulated carrier signal and a co-generated measurement signal synchronized with the modulation signal. There is a device for selectively inhibiting the modulation signal. A measurement device includes a counter device to selectively count the pulses of the modulated carrier signal for a first predetermined period of time and counting the pulses of the carrier signal for a second predetermined period of time while the modulation signal is inhibited and a measurement circuit, responsive to the co-generated measurement signal, to synchronously define the first predetermined period of time during which the modulated carrier pulses are counted and is responsive to a timing signal to define the second predetermined period of time during which the modulation signal is inhibited for counting the carrier pulses. The adjustment device is responsive to the measurement device, for varying the voltage applied to the voltage controlled oscillator to maintain the predetermined frequency of the carrier signal, and is responsive to the measurement device for varying the voltage applied to the voltage controlled oscillator to maintain the predetermined bandwidth of the modulated carrier signal.

25 Claims, 14 Drawing Sheets

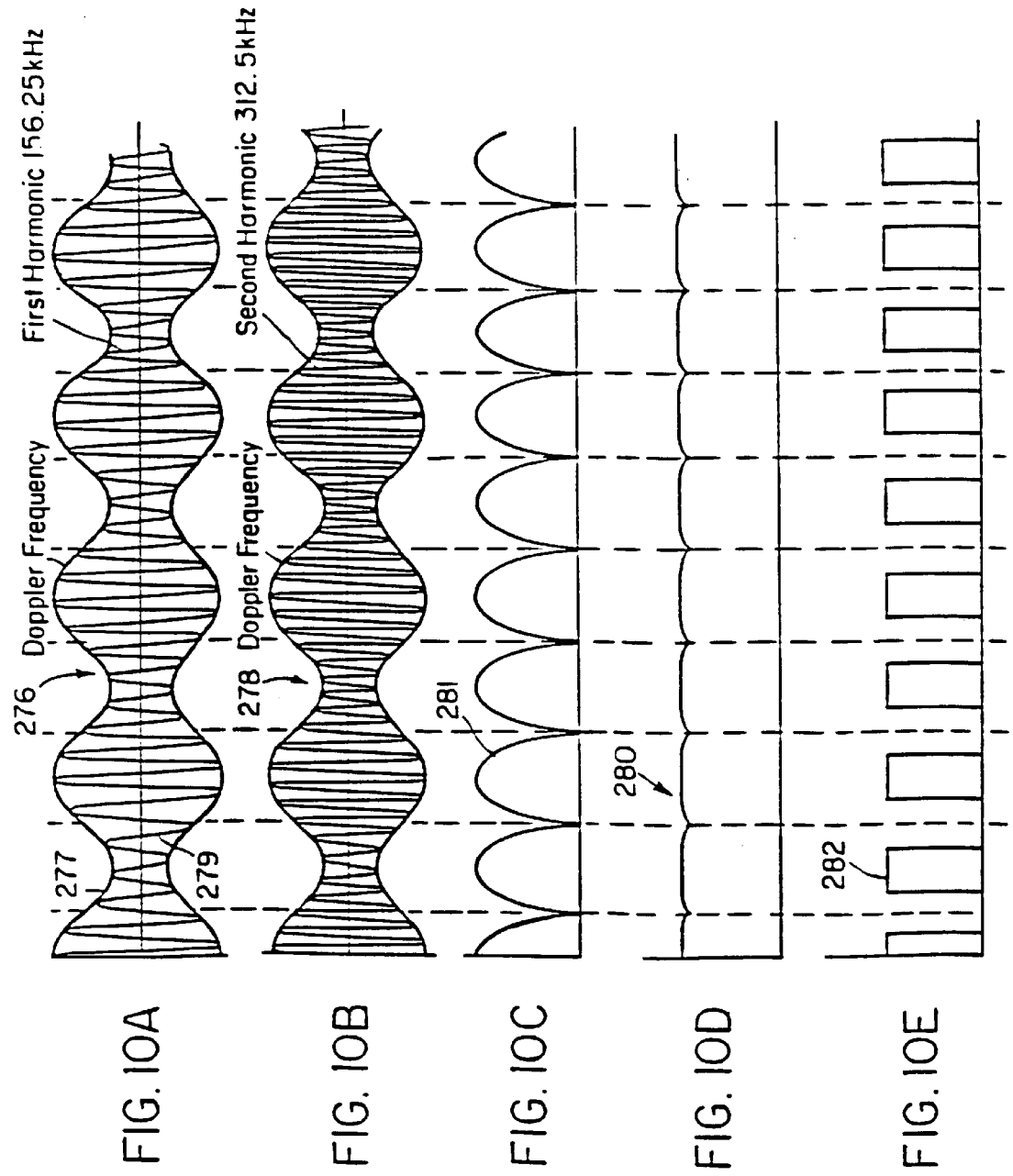

DIGITAL SYNCHRONIZATION OF BROADCAST FREQUENCY

FIELD OF INVENTION

This invention relates to a voltage controlled oscillator for transmitting an rf signal, and more particularly to a dynamic, self adjusting synchronization system for real time control of the bandwidth and center frequency of a modulated signal.

BACKGROUND OF INVENTION

When transmitting radiant energy, such as radar, to determine the range and velocity of an object, it is important to have consistent center frequency and bandwidth in order to accurately determine the exact range and velocity of the object.

Range errors occur when the bandwidth of the modulated signal varies, resulting in unreliable ranging capability. When the ranging capabilities are part of an anticipatory collision detection system to determine whether a collision with an object will occur, it is critical to consistently and accurately determine the range of the object. If the bandwidth changes, the range to the object will be inaccurate and produce a poor range resolution. For example, if the bandwidth decreases, the object will appear to be closer. In the case of a collision detection system, that means a signal to activate the passenger restraint system may occur too early, perhaps unnecessarily, if no collision occurs. If the bandwidth increases, the object will appear farther than it is and the system will activate too late or not at all. In order to determine when, if at all, a collision will occur, it is also imperative that the velocity as well as the range be determined accurately and quickly. If the frequency of the modulated signal increases or decreases, the velocity calculation will be inaccurate.

Not only must the frequency and bandwidth be determined accurately in the case of an anticipatory collision detection system for a passenger restraint system in an automobile, but it is important as well that the center frequency and bandwidth be adjusted instantaneously. This is due to the narrow window of time available to the collision detection system to determine whether a collision will occur, given the speed at which collisions often occur. If the frequency and bandwidth are not determined instantaneously, a collision may occur before the system can activate the passenger restraint system.

Accurate range and velocity determination is not the only reason for maintaining the center frequency and proper bandwidth. In order to stay within guidelines set by the FCC for unlicensed sensor operation at 5.8 GHz, proper frequency and bandwidth must be maintained.

Providing frequency and bandwidth control to an anticipatory collision detection system for a passenger restraint system for an automobile typically requires a substantial cost to manufacture and implement. It is important that the center frequency and bandwidth be maintained regardless of external influences such as temperature. However, in order to avoid temperature effects, expensive components must be used and considerable time must be spent in trimming and calibrating the components to perform in any environment. Alternatively, without such expensive components, calibration may take place after implementation in the automobile in order for proper operation in a particular environment. Neither option presents a cost effective means of manufacture or implementation.

It would therefore be advantageous to dynamically adjust the center frequency and bandwidth of a modulated signal quickly, regardless of external influences such as temperature, and provide such control while avoiding the need to trim and calibrate components during manufacture, or calibrate the components after implementation in an automobile.

SUMMARY OF INVENTION:

It is therefore an object of this invention to provide a dynamic self adjusting synchronization system for real time control of the bandwidth and frequency of a modulated signal.

It is a further object of this invention to provide such a dynamic self adjusting synchronization system which can adjust the bandwidth and center frequency very quickly.

It is a further object of this invention to provide such a dynamic self adjusting synchronization system which is not affected by external influences such as temperature.

It is a further object of this invention to provide such a dynamic self adjusting synchronization system which is cost effective to manufacture and implement and does not require rigorous calibration prior to shipment.

It is a further object of this invention to provide such a dynamic self adjusting synchronization system which maintains a center frequency and bandwidth in order to stay within FCC guidelines.

The invention results from the realization that truly effective frequency and bandwidth control of the carrier signal derived from a voltage controlled oscillator can be achieved by counting the cycles of a modulated carrier signal using a measurement signal co-generated with the modulation signal to provide a synchronized period of time in which the cycles are counted and comparing the actual count to a desired count, and adjusting the voltage at the input of the voltage controlled oscillator based on the result of the comparison and controlling the bandwidth by adjusting the peak to peak voltage of the modulation signal superimposed on a constant voltage level.

The invention features a dynamic, self adjusting synchronization system for real time control of the frequency of a modulated signal which includes a voltage controlled oscillator for generating a carrier signal of a predetermined frequency to be modulated. A modulation generator generates a modulation signal for modulating the carrier signal to produce a modulated carrier signal and a co-generated measurement signal synchronized with the modulation signal. A measurement device includes a counter device for counting the pulses of the modulated carrier signal for a predetermined period of time and includes a measurement circuit, responsive to the co-generated signal for defining the period of time during which the modulated carrier pulses are counted. An adjustment device, responsive to the measurement device, varies the voltage applied to the voltage controlled oscillator to maintain the predetermined frequency of the carrier signal.

In a preferred embodiment the modulation generator may include counting means, responsive to a predetermined clock signal, for producing the synchronized co-generated measurement signal which is a submultiple of the clock signal. The modulation generator may include a digital to analog converter for generating the modulation signal. The adjustment device may include a frequency control circuit for varying the voltage of the voltage controlled oscillator to change the frequency of the carrier signal.

The invention also features a dynamic, self adjusting synchronization system for real time control of the bandwidth of a modulated signal which includes a voltage controlled oscillator for generating a carrier signal to be modulated having a predetermined frequency and bandwidth. There is a modulation generator for generating a modulation signal for modulating the carrier signal. There is means for selectively inhibiting the modulation signal. A measurement device includes a counter device for counting the pulses the carrier signal for a predetermined period of time while the modulation signal is inhibited, and also includes a measurement circuit responsive to a measurement signal for defining a predetermined period of time during which the carrier pulses are counted. There is an adjustment device responsive to the measurement device for varying the voltage applied to the voltage controlled oscillator to maintain the predetermined bandwidth of the modulated carrier signal.

In a preferred embodiment the adjustment device may include a voltage control device for controlling the voltage level of the input to the voltage controlled oscillator. The adjustment device may include digital to analog converter means for operating the voltage control device. The modulation generator may include a counter, responsive to a predetermined clock signal, for producing a number of synchronized signals which are submultiples of the clock signal. The modulation generator may include a digital to analog converter for generating the modulation signal. The counter device may include counting means and the means for inhibiting may include means for clearing the counter. The means for clearing may reduce the modulation signal to zero. The counter device may be driven by a clock signal independent of the modulation generator for providing a period of time for which the cycles of the carrier signal are counted while the modulation generator is inhibited.

The invention also features a dynamic, self adjusting synchronization system for real time control of the bandwidth and frequency of a modulated signal which includes a voltage controlled oscillator for generating a carrier signal to be modulated having a predetermined frequency and bandwidth. There is an adjustment device including a center frequency adjustment circuit for providing a voltage level to said voltage controlled oscillator. There is a modulation generator for generating a modulation signal for modulating the carrier signal to produce a modulated carrier signal and a co-generated measurement signal synchronized with the modulation signal. There is means for selectively inhibiting the modulation signal. There is a measurement device including a counter device for selectively counting the pulses of the modulated carrier signal for a first predetermined period of time and counting the pulses of the carrier signal for a second predetermined period of time while the modulation signal is inhibited and including a measurement circuit responsive to the co-generated measurement signal for synchronously defining the first predetermined period of time during which the modulated carrier pulses are counted and responsive to a timing signal for defining the second predetermined period of time during which the modulation signal is inhibited for counting the carrier pulses. The adjustment device is responsive to the measurement device for varying the voltage applied to the voltage controlled oscillator to maintain the predetermined frequency of the carrier signal and is responsive to the measurement device for varying the voltage applied to the voltage controlled oscillator to maintain the predetermined bandwidth of the modulated carrier signal.

In a preferred embodiment the modulation generator may include a counter, responsive to a predetermined clock signal, for producing the synchronized co-generated measurement signal which is a submultiple of the clock signal. The modulation generator may include a digital to analog converter for generating the modulation signal. The adjustment device may include a frequency control circuit for varying the voltage of the voltage controlled oscillator to change the frequency of the carrier signal. The adjustment device may include a voltage control device for controlling the voltage level at the input to the voltage controlled oscillator. The adjustment device may include digital to analog converter means for operating the voltage control device. The counter may be responsive to a predetermined clock signal for producing a number of synchronized signals which are submultiples of the clock signal. The counter device may include counting means and the means for inhibiting may include means for clearing the counter. The means for clearing may reduce the modulation signal to zero. The counting means may be driven by a clock signal independent of the modulation generator for providing a period of time for which the cycles of the carrier signal are counted while the modulation generator is inhibited.

DISCLOSURE OF PREFERRED EMBODIMENT

Other objects, features and advantages will occur to those skilled in the art from the following description of a preferred embodiment and the accompanying drawings, in which:

FIG. 10A is a representation of the first harmonic of the modulation signal of the Doppler signal received from a potential colliding object, the envelope of which represents the Doppler shift;

FIG. 10B is a representation of the second harmonic of the modulation signal of the Doppler signal received from a potential colliding object, the envelope of which represents the Doppler shift;

FIG. 10C is a representation of the demodulated $K^{th}$ harmonic of the Doppler frequency;

FIG. 10D is a representation of a filtered harmonic which provides a DC voltage signal of that harmonic;

FIG. 10E is a representation of a Doppler harmonic output from a comparator circuit which provides a pulse signal of the same frequency as the Doppler harmonic;

Figure 1:
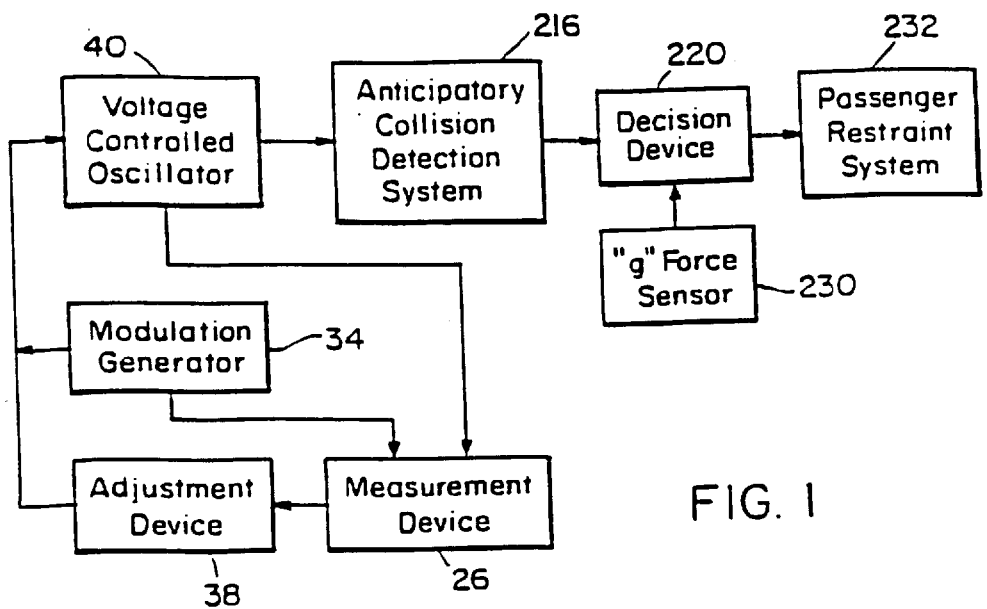
FIG. 1 is a simplified block diagram of the frequency and bandwidth control according to this invention used in an anticipatory collision sensor system.

In order to accurately determine the range of a potential colliding object, the carrier signal must be within a predetermined bandwidth. However, before the bandwidth can be determined it is critical that the proper center frequency of the carrier signal be generated. There is shown in FIG. 1 a simplified block diagram of the frequency and bandwidth control circuit of the present invention used in an anticipatory collision detection system. A modulation generator 34 produces a modulation signal of 156.25 KHz which modulates a 5.8 GHz carrier signal produced by voltage controlled oscillator 40. The modulated carrier signal is then sent to a measurement device 26 which measures the frequency of the modulated carrier signal for a predetermined period of time. This predetermined period of time is defined by a co-generated signal produced by modulation generator 34. Once the frequency has been measured by measurement device 26, a control word is sent to adjustment device 38 which varies the voltage at the input of voltage controlled oscillator 40 to adjust the center frequency to the desired frequency. Once the center frequency has been adjusted, the modulation signal produced by modulation generator 34 is reduced to zero, as shown in FIG. 5C, and measurement device 26 again measures the frequency produced by voltage controlled oscillator 40 and compares it to a predetermined frequency which represents the low end of the bandwidth. A control word is then sent to adjustment device 38 which attenuates the peak to peak voltage of the modulation signal produced by modulation generator 34 to obtain the desired bandwidth. Measurement device 26 again measures the modulated carrier signal frequency from voltage controlled oscillator 40 to determine the center frequency and adjusts the center frequency as discussed above.

The frequency and bandwidth adjustments are repeated until the desired center frequency and bandwidth are obtained. Once the proper center frequency and bandwidth are obtained, anticipatory collision detection system is ready for operation and periodically checks and corrects the center frequency and bandwidth. Anticipatory collision detection system 216 transmits a modulated carrier signal which encounters potential colliding objects within a predetermined range of the system which reflect the modulated carrier signal. Due to the Doppler effect, the reflected radiation signal will be shifted in frequency. The reflected radiation signal is received by anticipatory collision detection system 216 which determines whether or not a collision is imminent. If it is determined that no collision will occur, the center frequency and bandwidth are periodically monitored and adjusted until another object is detected. When it has been determined that a collision is imminent, a fire signal is sent to decision device 220. When the actual collision occurs, g force sensor 230 sends a fire signal to decision device 220 which then sends a fire signal, based on the signals received from anticipatory collision detection system 216 and g force sensor 230, to passenger restrain system 232. Alternatively, the fire signal could be used as the primary signal to deploy the passenger restraint system.

Figure 2:
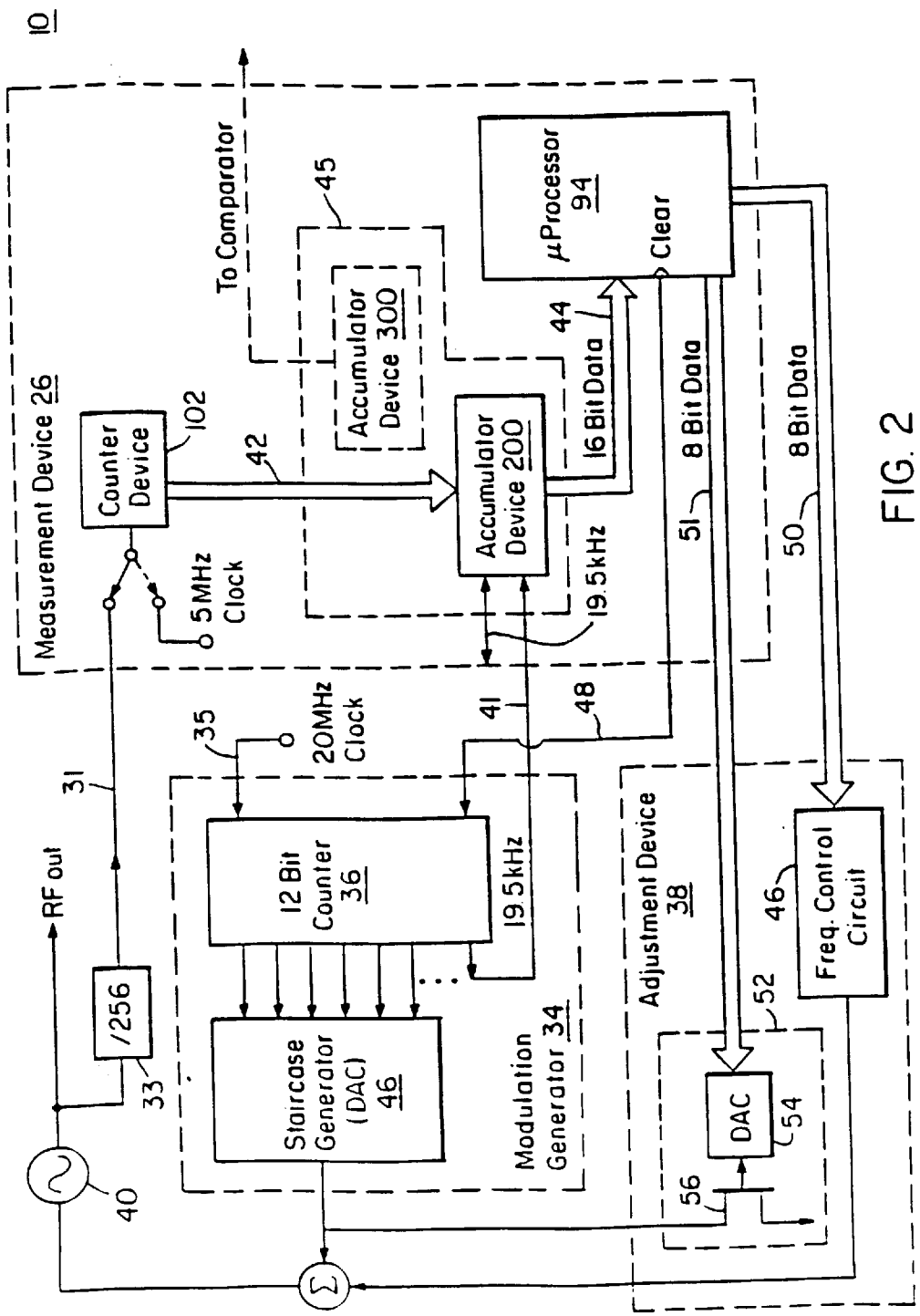
FIG. 2 is a more detailed schematic of the frequency and bandwidth control circuit of FIG. 1.

The center frequency and bandwidth control is shown in greater detail in FIG. 2. In order to accurately compensate the center frequency, regardless of external influences such as temperature, it is important to measure the modulated carrier center frequency with a signal co-generated with the modulation signal. Modulation generator 34 includes a 12-bit divide-by-2 counter 36 for generating a plurality of digital signals used to produce the modulation signal which modulates the carrier signal produced by voltage controlled oscillator 40. A divide-by-256 prescalar 33 is provided at the output of voltage controlled oscillator 40 to divide the radar frequency to a lower frequency more compatible for digital processing. In a preferred embodiment, divide-by-256 prescalar 33 includes a divide-by-4 prescalar followed by a divide-by-64 prescalar. Divide-by-256 prescalar 33 delivers the modulated carrier signal via line 31 to drive a measurement device 26 which includes a counter device 102 interconnected with a measurement circuit 45 which includes an accumulator device 200 by a signal bus 42. Counter device 102 continuously counts the cycles of the modulated carrier signal. With every cycle of a 19.5 KHz signal also produced by 12-bit counter 36 and supplied via signal path 41 accumulator device 200 reads the count from counter device 102 and sends an interrupt to a microprocessor 94, a portion of which is included in measurement device 26, via signal path 44. The process is repeated with each cycle of the 19.5 KHz. After microprocessor 94 receives 8 interrupts from accumulator device 200, microprocessor 94 reads the modulated carrier signal cycle count stored in accumulator device 200, resets counter device 102 and clears accumulator device 200. Microprocessor 94 then refers to a look-up table to determine what frequency is associated with that total count. For example, for a center frequency of 5.8 GHz, the cycle count would equal 9294. If the count was 9296, the frequency would be 5.801 GHz. Thus, by accumulating the counter value for 8 cycles of the 19.5 KHz signal, we obtain a resolution of at least 1 MHz: for every 1 MHz variance of the carrier signal there is a corresponding change in the cycle count. Thus, an average of 64 cycles of the modulated carrier signal is provided. It is important to use a synchronized measurement signal: in order that no error is introduced into the average, the measured frequency and the measuring frequency must start and stop in the same place. If the counter value was accumulated over 2 cycles of the 19.5 KHz signal we would average only 16 cycles of the modulated carrier signal which would not provide a 1 MHz resolution. Similarly, if the counter value was accumulated over 4 cycles of the 19.5 KHz signal we would average only 32 cycles of the modulated carrier signal which still would not provide a 1 MHz resolution. Accumulating the counter value for 16 cycles of the 19.5 KHz signal takes too much time. Therefore, accumulating the counter value for 8 cycles of the 19.5 KHz signal provides both the desired resolution and the least amount of time.

This can be better understood by referring the table below where the count is determined by $T_{19.5\,KHz}/t_{22.6\,MHz}$ where T is the period of the measuring signal and t is the period of the carrier signal.

| $f_c$ (GHz) | count $\frac{T_{19.5\,KHz}}{t_{22.6\,MHz}}$ (2 cycles) | count $\frac{T_{19.5\,KHz}}{t_{22.6\,MHz}}$ (4 cycles) | count $\frac{T_{19.5\,KHz}}{t_{22.6\,MHz}}$ (8 cycles) |
| --- | --- | --- | --- |
| 5.8 | 1161.85 | 4647.4 | 9294.8 |
| 5.801 | 1162.05 | 4648.2 | 9296.4 |
| 5.802 | 1162.25 | 4649.0 | 9298.0 |
| 5.803 | 1162.45 | 4649.8 | 9299.6 |
| 5.804 | 1162.65 | 4650.6 | 9301.2 |
| 5.805 | 1162.85 | 4651.4 | 9302.8 |
| 5.806 | 1163.05 | 4652.2 | 9304.4 |

Column one represents the center frequency and columns two, three and four represent the carrier signal cycle count for 2,4 and 8 cycles of the 19.5 KHz signal, respectively. Referring to column two, for a frequency shift of 1 MHz from 5.8 GHz to 5.801 GHz, the least significant figure of the count changes by one. However, subsequent counts reveal that not until the center frequency has shifted by 6 MHz to 5.806 GHz does the least significant figure of the count change again. Thus, counting the cycles of the carrier signal for only two cycles of the 19.5 KHz signal yields a minimum resolution of 5 MHz.

Similarly, referring to column three, for a frequency shift of 1 MHz from 5.8 GHz to 5.801 GHz, the least significant figure of the count changes by one. The same is true for a frequency shift of 2 MHz. However, for a frequency shift of 3 MHz, 5.8 GHz to 5.803 GHz, the least significant figure has only changed by two. Therefore, counting the carrier signal cycles for four cycles of the 19.5 KHz signal still does not provide a suitable frequency resolution.

Referring now to column four, for a frequency shift of 5.8 GHz to 5.801 GHz, the least significant figure of the count changes by two. Similarly, for a frequency shift of 5.8 GHz to 5.802 GHz, the least significant figure changes by four. As can be seen by the remainder of column four, each frequency shift of 1 MHz correlates to a change in the least significant figure, thus providing a frequency resolution of at least 1 MHz. While a similar result would be realized for 16 cycles of the 19.5 KHz signal, as discussed above, this would take to much time and therefore eight cycles of the 19.5 KHz signal is the optimum number of cycles to use.

If the counter value correlates to a center frequency other than 5.8 GHz, microprocessor 94 sends a correction word to frequency control circuit 46 within adjustment device 38. Frequency control circuit 46, such as a digital to analog converter, varies the voltage at the input of voltage controlled oscillator 40 to adjust the center frequency to the desired value, 5.8 GHz.

Once the center frequency has been adjusted to the proper value, the bandwidth of the modulated carrier signal can be determined. Modulation generator 34 includes stair case generator 45 which produces a sawtooth analog signal at a frequency of 156.25 KHz. This sawtooth signal is superimposed on a constant voltage level, also produced by 12-bit counter 36. This constant voltage level may be positive, zero, or negative. After correcting the center frequency, microprocessor 94 sends a CLEAR signal to 12-bit counter 36 via signal path 48 which momentarily clears the counter and reduces the modulation signal to zero. At this point, the only output from 12-bit counter 36 is the constant voltage level. With the modulation signal at zero, the frequency of the carrier signal produced by voltage controlled oscillator 40 is determined in the same manner as the center frequency discussed above. However, once the frequency has been determined it is compared to a predetermined value which represents the lower end of the desired bandwidth. In a preferred embodiment, this frequency is 5.75 GHz: FCC guidelines permit a bandwidth no greater than 150 MHz for unlicensed sensor operation at a center frequency of 5.8 GHz. If the frequency is determined to be different than the desired frequency of 5.75 GHz, microprocessor 94 sends a control word via signal path 51 to voltage control device 52. A digital to analog convertor 54 adjusts the bias to junction field effect transistor (JFET) 56 which attenuates the modulation signal produced by modulation generator 34.

Since attenuating the modulation signal affects the input voltage to voltage controlled oscillator 40, the center frequency will necessarily be affected. Therefore, it is necessary to again determine and adjust the center frequency in the manner discussed above. The bandwidth and center frequency are alternately adjusted until the proper values of center frequency and bandwidth are obtained. At initial start-up of the system, this may take a number iterations.

Figure 3:
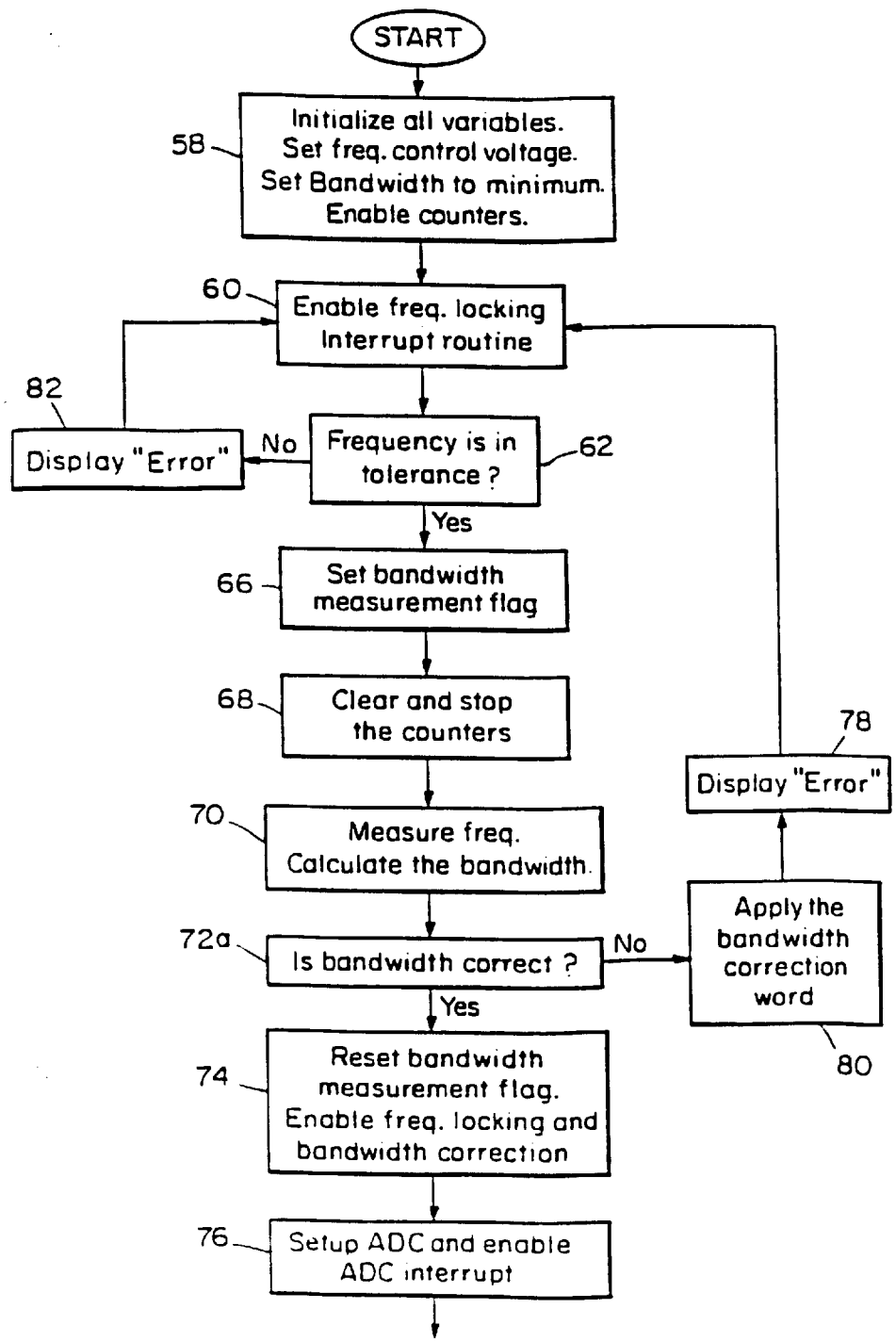
FIG. 3 is a flow chart of a basic frequency and bandwidth routine according to this invention.

FIG. 3 is a flow chart of the routine used by microprocessor 94 to initially set the center frequency and bandwidth. At start-up, the control voltage provided by frequency control circuit 46 is set, 12-bit counter 36 and counter device 102, FIG. 2, are enabled and the bandwidth is set to the minimum, step 58. In step 60, the frequency locking interrupt routine is enabled and the center frequency is determined. In step 62, the center frequency is compared to the desired frequency to determine if the center frequency is in tolerance. If the frequency is not within tolerance, an error message is displayed, step 82, and the frequency locking interrupt routine of step 60 is again enabled. If the frequency is determined to be the proper center frequency, the bandwidth measurement flag is set, step 66. Once the bandwidth measurement flag is set a CLEAR signal is sent to the counters, step 68, and the frequency is determined, allowing the bandwidth to be determined, step 70. The bandwidth is then compared to the desired bandwidth in step 72. If the bandwidth is not correct, a bandwidth control word is sent to adjust the peak to peak voltage of the modulation signal, step 80, an error signal is displayed and the frequency locking loop is again enabled, step 78. Once the bandwidth is determined to be correct, step 72, the bandwidth measurement flag is reset, and the frequency locking interrupt routine and bandwidth correction are enabled periodically, step 74.

Figure 4:
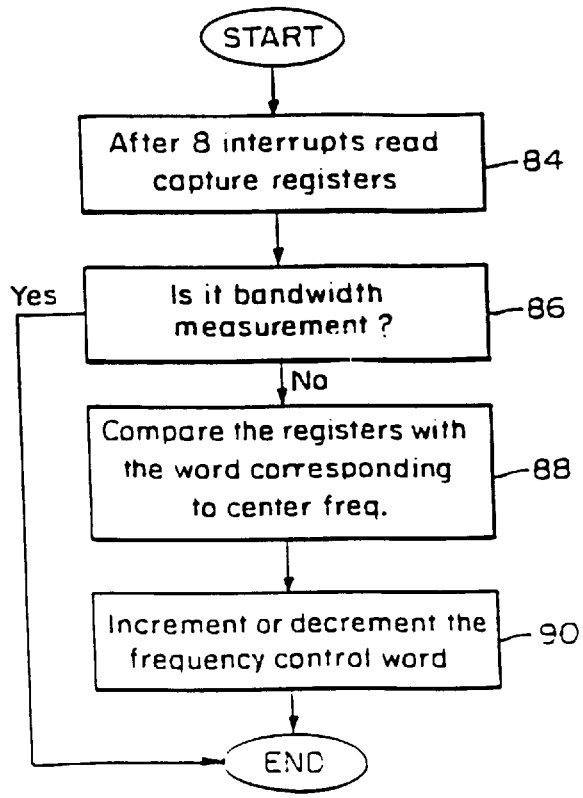
FIG. 4 is a flow chart of a frequency locking interrupt subroutine which determines the center frequency.

The frequency locking interrupt routine is represented by the flow chart of FIG. 4. In step 84, once the microprocessor receives 8 interrupts, it reads accumulator device 200, FIG. 2. In step 86, if the measurement being performed is a bandwidth measurement, the routine ends. However, if the measurement is the center frequency measurement, the count from accumulator device is compared to the count corresponding to the proper center frequency in step 88. In step 90, the frequency control word is incremented or decremented based on the comparison performed in step 88. Once the frequency control word is adjusted, the frequency locking interrupt routine is ended.

Figure 5A:
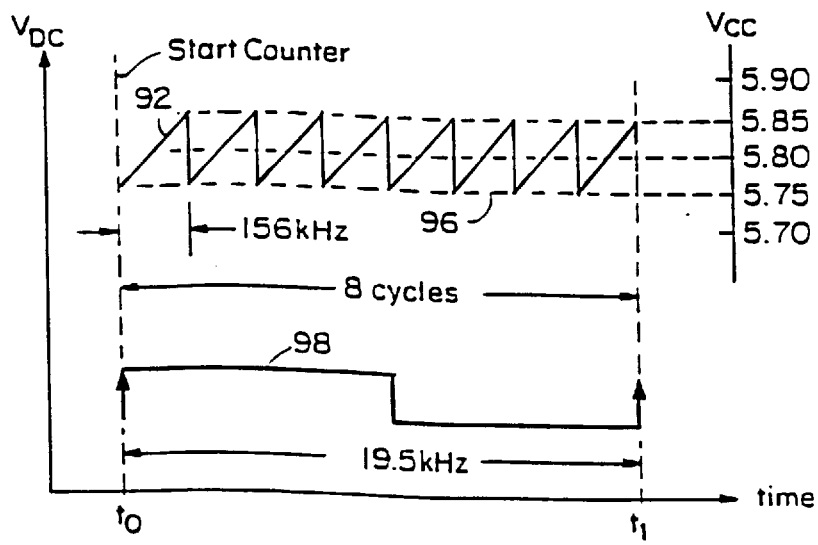
FIG. 5A is a representation of the sawtooth output of the modulation generator being counted for one cycle of a co-generated signal and the carrier signal frequencies associated with the sawtooth amplitudes.
Figure 5B:
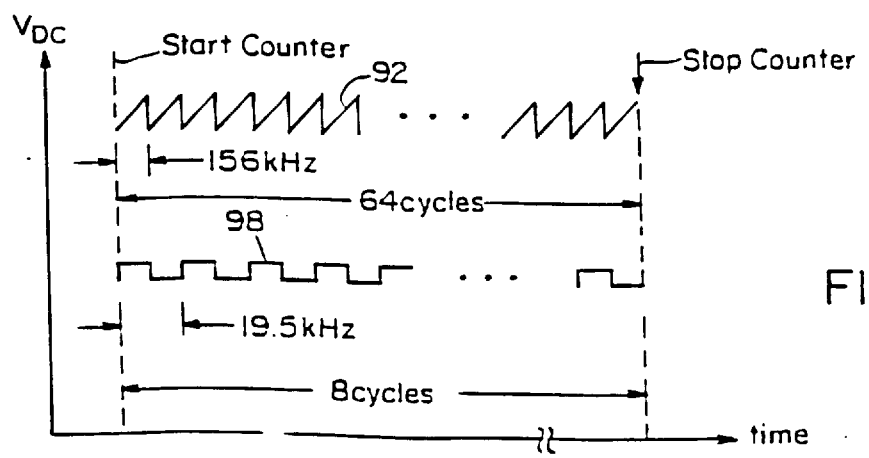
FIG. 5B is a view similar to FIG. 5A, representing the sawtooth cycles being counted for 8 cycles of the co-generated signal.
Figure 5C:
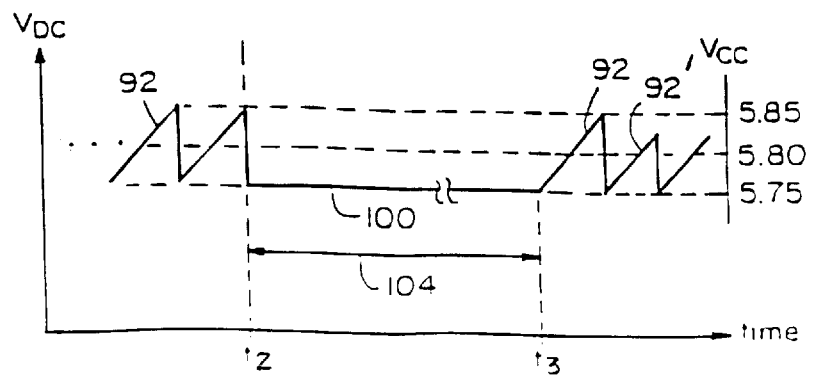
FIG. 5C is a view of the sawtooth of FIG. 5B after the counter is momentarily cleared by the microprocessor for a time period $t_2$ to $t_3$.

A better understanding of the counting of the cycles can be gained from FIGS. 5A–5C. FIG. 5A is a representation of the sawtooth output of modulation generator 34, FIG. 2. A sawtooth waveform 92 is superimposed on a constant voltage level 96. A 19.5 KHz signal 98, synchronously derived from 12-bit divide-by-2 counter 36, starts at time $t_0$ and ends at time $t_1$. In the time period $t_0$ to $t_1$ sawtooth waveform 92 has cycled 8 times.

Referring now to FIG. 5B, there is shown a waveform 92 being measured for 8 cycles of 19.5 KHz signal 98. After 8 cycles of 19.5 KHz signal 98, the total cycles of sawtooth 92 are read from the accumulator device, step 84, FIG. 4, and the total number is then compared to the number corresponding to the proper center frequency, step 88, FIG. 4. Once the comparison is made, the frequency is adjusted until the proper center frequency is obtained, step 90, FIG. 4.

Referring to FIG. 5C, once the proper center frequency is obtained, at a time $t_2$ the counter is cleared and the modulation signal 92 is reduced to zero. The only output of modulation generator 34, FIG. 2, is now a constant voltage level 100. The frequency is then measured, step 70, FIG. 3, and at time $t_3$ the modulation signal 92 is adjusted by applying the bandwidth control word, step 80, FIG. 3, to voltage control device 54, FIG. 2, which attenuates the amplitude of the sawtooth waveform 92 to produce sawtooth waveform 92'.

Figure 6A:
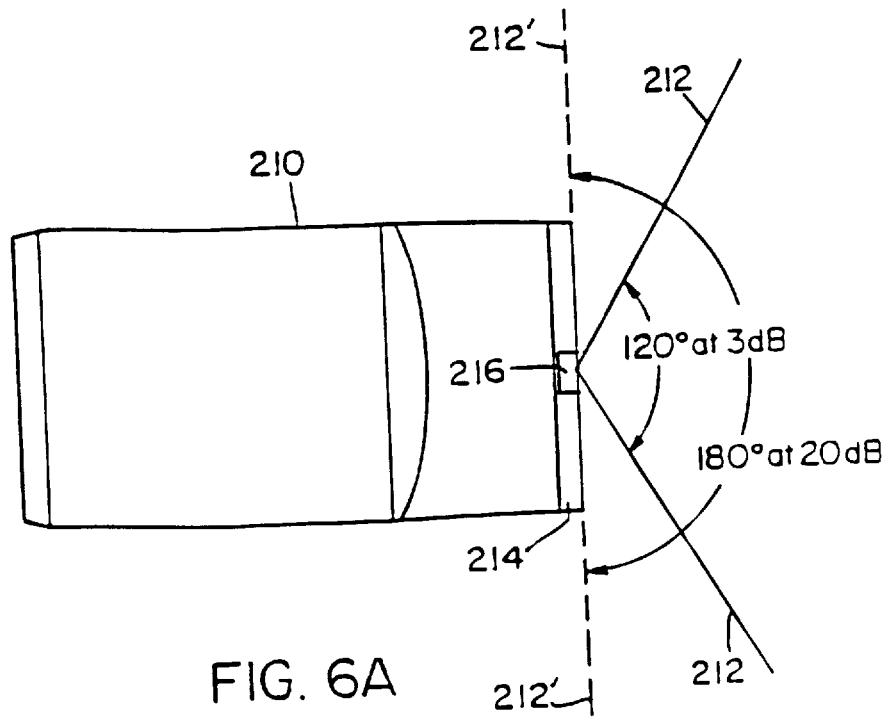
FIG. 6A is a top view of an automobile showing the horizontal field of view of an anticipatory collision sensor system incorporating the frequency and bandwidth control of the present invention.

The frequency and bandwidth control of the present invention is particularly useful in an anticipatory object detection system such as described herein below. There is shown in FIG. 6A an anticipatory object detection system 216 centrally located within a bumper 214 of an automobile 210. Object detection system 216 transmits a radar signal which produces a radar cone 212 having a horizontal radiation cross section of 120° at 3 dB directed in front of automobile 210. However, at 20 dB the effective cross section or field of view is 180° and is represented by the dashed line 212'. It is the effective field of view 212' that allows the object detection system 216 to detect potential colliding objects directly in front of the automobile 210 as well as objects to either side of the automobile 210.

Figure 6B:
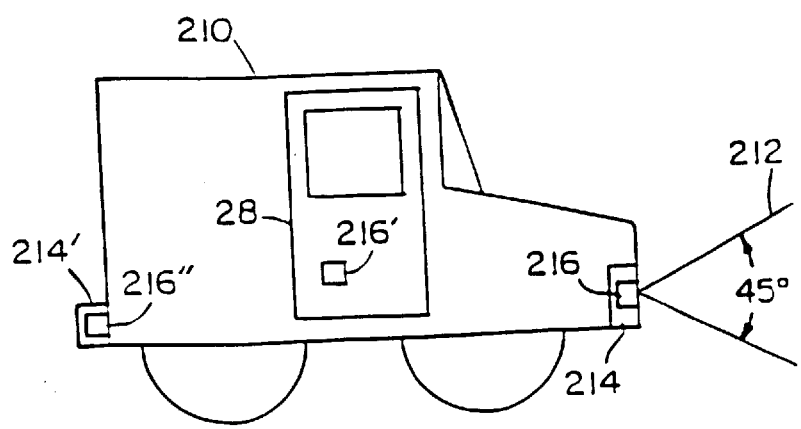
FIG. 6B is a side view of FIG. 6A and shows the vertical field of view of the collision sensor.

FIG. 6B is a side view of the automobile 210 of FIG. 6A. Object detection system 216 centrally located within bumper 214 produces the same radar cone 212 as shown in FIG. 6A, however, the vertical radiation cross section of the radar cone is 45°. Object detection system 216 may be adjusted to project a radar cone 212 a predetermined height and distance in front of the automobile 210. It should be noted that the object detection system 216 is not limited to being located in the front bumper. Anticipatory object detection system 216 may be located at any location that may potentially encounter a collision with an object. For example, object detection system 216' may be located within the doors 238 of the automobile 210 to detect a side impact, or in the rear bumper 214' to detect a collision from behind. The object detection system is generally located equidistant from the edges of the automobile. This allows not only symmetric protection around the automobile, but also the use of simpler software which reduces processing time by the microprocessor.

Figure 7:
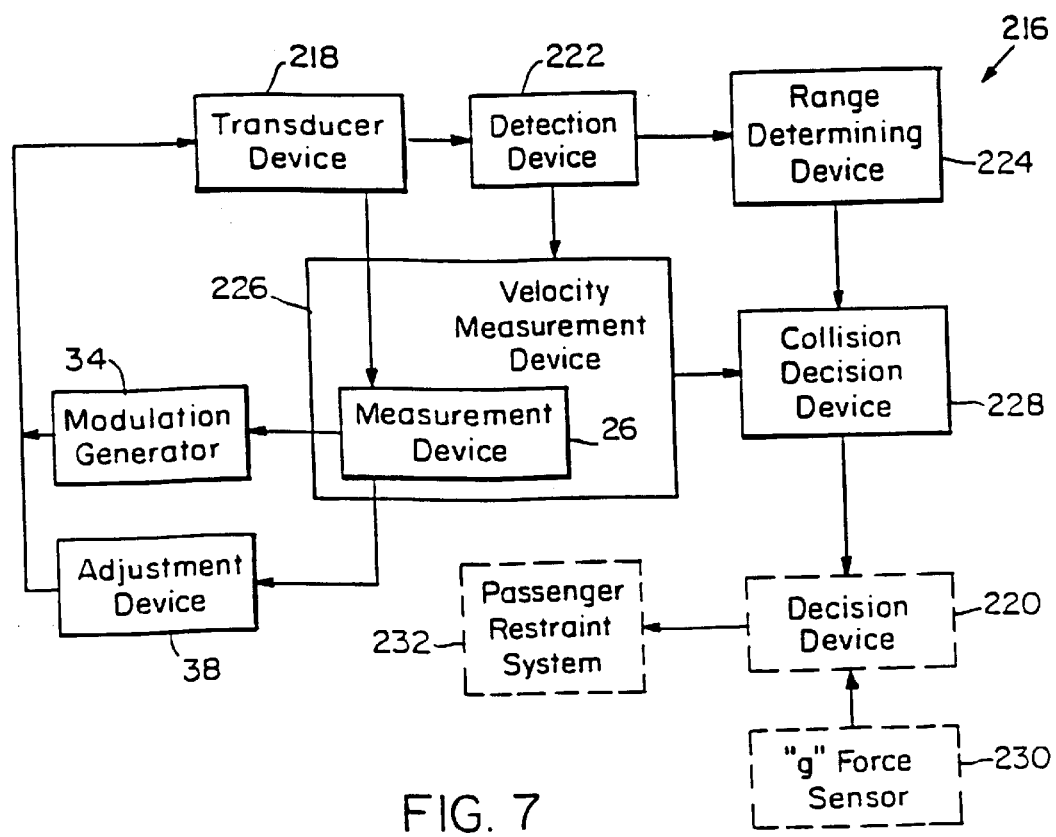
FIG. 7 is a simplified block diagram of an anticipatory collision detection system incorporating the frequency and bandwidth control circuit according to this invention.

Anticipatory object detection system 216 is shown in more detail in FIG. 7. A transducer device 218 transmits a modulated carrier signal, for example, a radar signal. The modulated carrier signal then encounters a potential colliding object within a predetermined range of transducer device 218 which reflects the signal. Due to the Doppler effect, the reflected signal will be shifted in frequency. The shift will be dependent on whether the object and vehicle are moving towards or away from each other. For example, for an object moving towards the object detection system 216 the frequency of the reflected signal will be higher than the frequency of the transmitted signal. For an object moving away from the object detection system 216 the frequency of the reflected signal will be lower than the frequency of the transmitted signal.

The reflected modulated carrier signal is received by transducer device 218, and a detection device 222 beats the received, reflected modulated carrier signal with the modulated carrier signal. This produces a composite Doppler signal having a frequency which is the frequency difference between the two signals, representing the Doppler shift of the reflected signal, and is comprised of a plurality of Doppler shifted harmonic components. This Doppler shift is present throughout the signal and thus present in all components of the signal. The Doppler frequency is represented by the envelope of the signals produced by detection device 222. Detection device 222 extracts the Doppler which envelops the harmonic components of the modulation signal of the Doppler signal. Once the Doppler is extracted, range determining device 224 determines the range of an object by comparing the amplitudes of the Doppler in each harmonic component relative to each other. When the object is within a predetermined range, defined by the intersection of two predetermined harmonic components, velocity measurement device 226 determines the relative velocity of the object using the Doppler frequency of the return signal as discussed in more detail in FIG. 9. Range determining device 224 continues to monitor the amplitudes of the Doppler of the harmonic components. The harmonic components are monitored by comparing their relationship relative to each other to predetermined values which represent what these amplitudes would be in an actual collision. Anticipatory collision decision device 228 determines that a collision is imminent, based on range information from range determining device 224 and velocity information from velocity measurement device 226, and sends a fire signal, along with relative velocity information, to a decision device 220, shown in phantom, typically part of an existing passenger restraint system. Decision device 220 receives this information along with information obtained from a conventional g force sensor 230, also shown in phantom. The g force sensor 230 is typically located within the passenger compartment. While the preferred embodiment is directed to an airbag passenger restraint system, anticipatory object detection system 216 may be used in conjunction with seatbelt pretensioners which tighten the seatbelts early in the collision prior to impact. Further, the anticipatory collision sensor system may be used as a primary sensor as well as a sensor for augmenting g force sensor 230 or as an audible or visual alarm.

Figure 8:
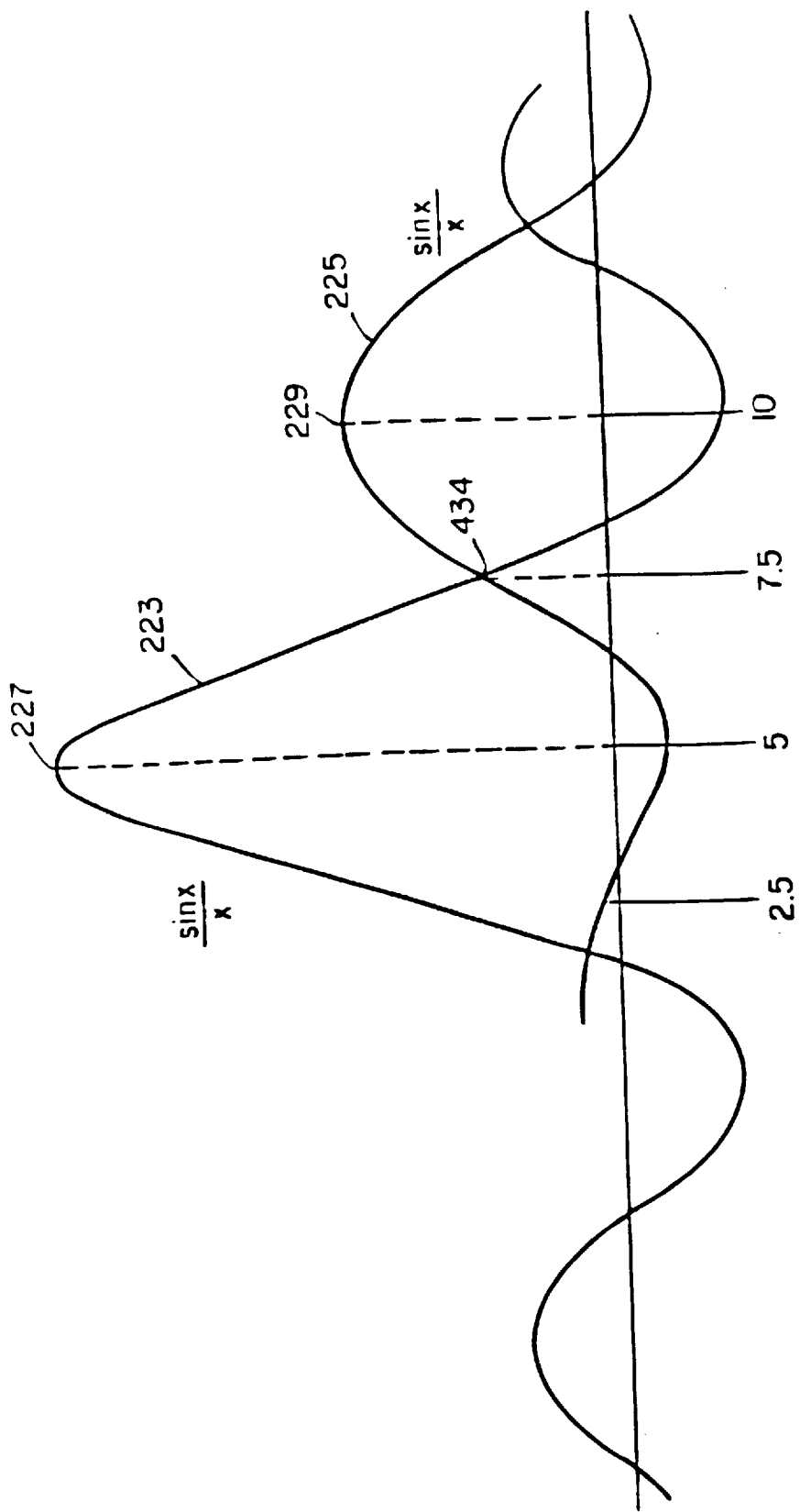
FIG. 8 is a representation of the actual amplitudes of the first and second harmonic components of the modulation signal of the Doppler signal.

The actual amplitudes of the first and second harmonic components of the modulation signal are represented by waveforms 223 and 225, as shown in FIG. 8, respectively. In a modulated carrier signal, the harmonic components of the modulation signal will peak at fixed distances for a given bandwidth of the carrier signal independent of frequency. For example, in a modulated carrier signal in which the carrier signal has a bandwidth of 100 MHz, the first harmonic component 223 of the modulation signal has a peak 227 at 5 feet. Similarly, the second harmonic component 225 of the modulation signal has a peak 229 at 10 feet. The point at which the two harmonic components intersect 434 will be ½ the distance between the peaks, or 7.5 feet. Therefore, for a signal reflected from an object, where the amplitudes of the first and second harmonic components of the modulation signal are equal, the instantaneous range of the object is known. The distances at which the amplitudes peak can be directly controlled by the bandwidth of the carrier signal. For example, a carrier signal having a bandwidth of 200 MHz would have a first harmonic component of the modulation signal peak at 2.5 feet and the second harmonic component would peak at 5 feet. Thus, the range of an object can be detected based solely on the bandwidth of the carrier signal regardless of the frequency of either the carrier signal or the modulation signal. Once the instantaneous range of an object is determined, the instantaneous range of the object can be tracked by counting the Doppler pulses, discussed in greater detail in FIG. 9, from that point on: each Doppler pulse represents the relative movement of the object in ½ inch increments. The range detected is the radial distance from the antenna.

Figure 9:
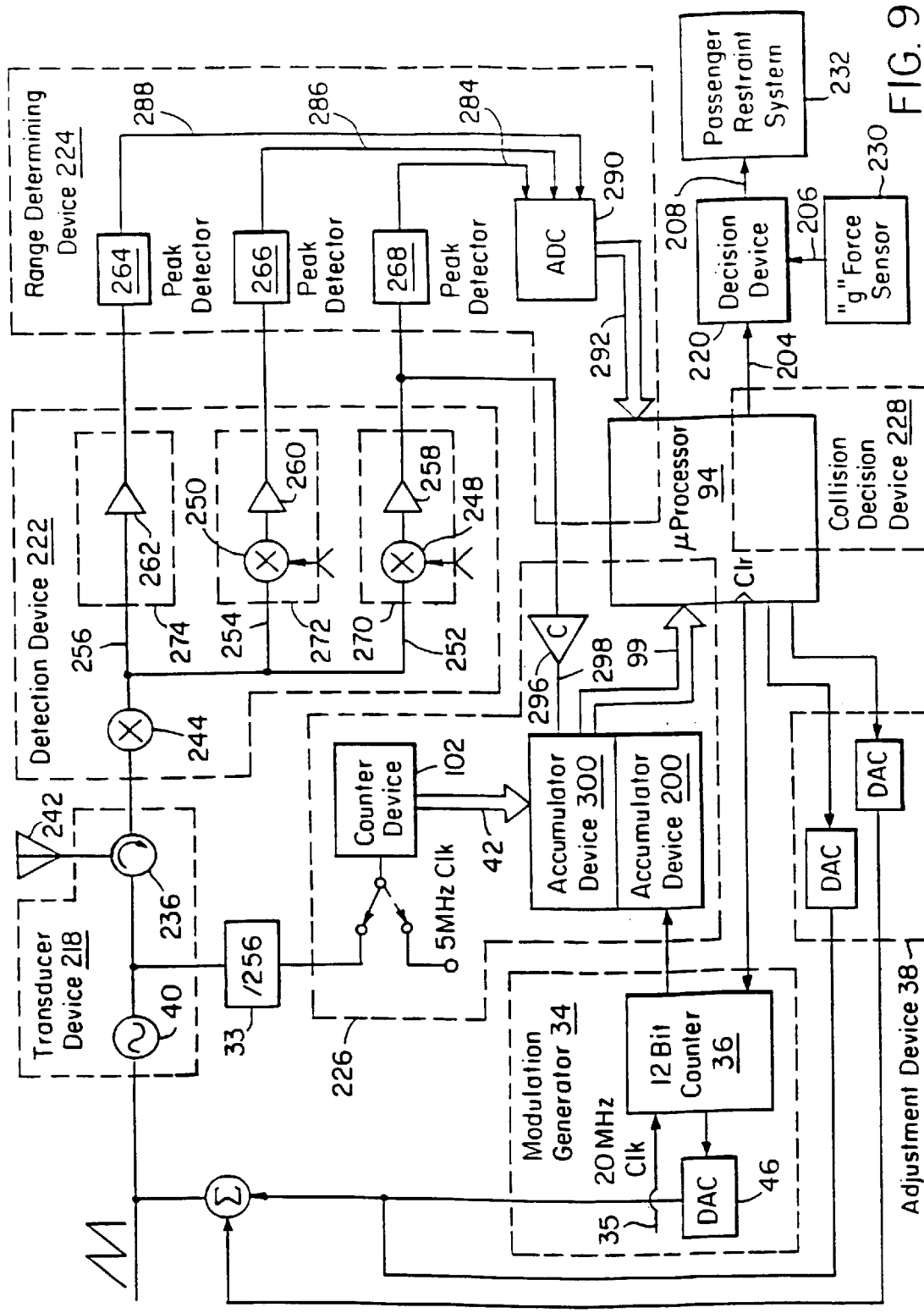
FIG. 9 is a more detailed schematic of an anticipatory collision sensor system incorporating the bandwidth and frequency control circuit of FIG. 2.

A more detailed schematic of the anticipatory collision detection system is shown in FIG. 9. Transducer device 218 includes a voltage controlled oscillator 40 which generates a carrier signal having a center frequency of 5.8 GHz. In order to remain within FCC guidelines for unlicensed sensor operation, the bandwidth of the signal must be such that the carrier signal stays within the range of 5.725 GHz to 5.875 GHz. In this embodiment, the carrier signal is modulated at a frequency of 156.25 KHz. The frequency range, or bandwidth, of voltage controlled oscillator 40 is dictated by the changes in amplitude of the modulation signal. The modulation frequency is typically chosen to be at least ten times larger than the Doppler frequency. It must be of sufficient frequency such that leakage throughout the system will not affect the Doppler frequency.

A circulator 236 delivers the modulated carrier signal to antenna 242.

Antenna 242 transmits the modulated 5.8 GHz carrier signal, which is reflected off objects within a predetermined range, typically two to ten feet away to just beyond the bumper. The reflected signal is then received by antenna 242. The transducer device of the preferred embodiment is provided in a single MMIC radar chip manufactured by Hittite Corporation of Massachusetts and includes a single transmit/receive antenna. However, independent transmit and receive antennas may be used. It is important, however, that a broad beam antenna is used to provide sufficient field view of the system.

Detection device 222 beats the received signal with the modulated carrier signal using mixer 244. The local oscillator for mixer 244 is provided by the leakage of the modulated carrier signal from circulator 236. Mixer 244 produces a beat frequency, or composite Doppler signal, which is the frequency difference between the modulated carrier signal and the received reflected signal. The composite Doppler signal is comprised of a plurality of signals to include the harmonic components of the reflected modulation frequency. The frequency of the harmonics of the modulation frequency present in the composite Doppler signal differ from the modulation frequency by the Doppler frequency.

For purposes of this embodiment, the harmonic components of interest are the first harmonic component, second harmonic component and the DC harmonic component of the modulation signal. Detection device 222 contains a plurality of signal paths 252, 254, and 256 which deliver the Doppler shifted harmonic components to a plurality of channels 270, 272, and 274 respectively, for extracting the Doppler from the harmonic components. In a preferred embodiment, channel 270 contains a mixer 248 which mixes the Doppler shifted first harmonic component, represented by waveform 276 as shown in FIG. 10A, with the modulation signal, 156.25 KHz: Envelope 277 represents the Doppler frequency while the first harmonic is represented by waveform 279. This demodulation extracts the Doppler of the first harmonic component of the modulation signal, or first Doppler, the envelope of the Doppler shifted harmonic component. Channel 270 also includes a Doppler amplifier 258 which includes a pulse shaping circuit that amplifies and rectifies the first Doppler. This signal is represented by waveform 281 as shown in FIG. 10C. Thus, this signal has the frequency of the Doppler frequency and the amplitude represents the variations of the first harmonic component of the modulation signal of the reflected signal. The Doppler amplifier 258 supplies the amplified, rectified, first Doppler to a range determining device 224. Range determining device 224 includes a peak detector 268 which includes an RC network which produces a DC voltage as illustrated by waveform 280 in FIG. 10D.

In a similar manner as channel 270, channel 272 contains a mixer 250 which mixes the Doppler shifted second harmonic component, represented by waveform 278 as shown in FIG. 10B, with a signal which is twice the frequency of the modulation signal, 312.5 KHz. This demodulation produces the Doppler of the second harmonic component, or second Doppler, of the modulation signal. Channel 272 also contains Doppler amplifier 260 which includes a pulse shaping circuit which amplifies and rectifies the second Doppler. This signal is similar to that illustrated by waveform 281 in FIG. 10C. The amplified, rectified second Doppler is then delivered to range determining device 224. Range determining device 224 includes a peak detector 266, similar to peak detector 268, which produces a DC voltage output similar to that illustrated by waveform 280 of FIG. 10D.

Channel 274 includes a Doppler amplifier 262 which amplifies and rectifies the Doppler signal to produce the Doppler of the direct current (DC) or fundamental harmonic component, or DC Doppler, of the reflected modulation signal. The DC Doppler is delivered to peak detector 264, similar to peak detectors 266 and 268, to produce a DC voltage similar to waveform 280 of FIG. 10D.

The DC voltage signals of the first Doppler, second Doppler, and DC Doppler are delivered to an analog to digital converter 290 via signal paths 284, 286 and 288 respectively. Analog to digital converter 290 converts the DC voltages to digital signals which it then supplies to a microprocessor 94 via signal bus 292. Microprocessor 94, through the implementation of software discussed below, monitors the Doppler amplitude of each harmonic component and its relationship with the Doppler amplitudes of the other harmonic components to determine the instantaneous range of an object. The instantaneous range is determined using the intersection of the first and second Doppler amplitudes. The amplitude, phase, and relative Doppler sideband character of each of the harmonic components are a function of object range, relative velocity magnitude and sense, and peak to peak frequency deviation. Once a predetermined relationship between the harmonics is detected, microprocessor 94 enables velocity measurement device 226 to determine the instantaneous velocity of the object.

Velocity measurement device 226 includes a comparator device 296. In one embodiment, comparator 296 is connected to the output of channel 270 of detection device 222 since the first harmonic component has the greatest amplitude. However, comparator 296 may be placed at the output of either channel 272 or 274. Comparator 296 receives the amplified, rectified first Doppler and compares the level of that output to a predetermined value. If the level of the input exceeds a predetermined value, comparator 296 outputs a high signal. If the input does not exceed the predetermined value, comparator 296 outputs a low value. The resulting output, a series of Doppler pulses illustrated by waveform 282 as shown in FIG. 10E, is delivered over signal path 298 to velocity measurement device 226. Velocity measurement device 226 includes a velocity measurement circuit having an accumulator device 300, such as a capture register, which is driven by the Doppler pulse supplied over signal path 298. During velocity measurement, accumulator device 200 is disabled and accumulator device 300 is enabled. Counter device 102 interconnected with accumulator device 300 via signal bus 297. Counter device 102, driven by an internal 5 MHz clock, continuously counts the cycles of the 5 MHz clock. With every rising edge of the Doppler pulse from comparator 296, accumulator device 300 sends an interrupt to microprocessor 94, a portion of which is shared with range determining device 224, and simultaneously reads counter device 102 and stores the number of cycles counted. With every interrupt received by microprocessor 94 from accumulator device 300 microprocessor 94 reads the cycle count stored in accumulator device 300, resets counter device 102 and increments a Doppler count by 1. The Doppler count represents the number of Doppler pulses received. Thus, velocity measurement device 226 counts the number of 5 MHz clock pulses that occur for each Doppler pulse. Since the Doppler pulse is derived from a rectified Doppler component, each pulse represents one half Doppler cycle. The process is repeated with each rising edge of the Doppler pulse, each 5 MHz cycle count being added to the previous cycle count stored in microprocessor 94, until the Doppler count is equal to 4. Once the Doppler count equals 4, the microprocessor 94 discontinues reading accumulator device 300 and divides by 4 the total count stored to provide an average 5 MHz cycle count. Microprocessor 94 then refers to a look up table to determine what velocity is associated with that average count. While there are many ways the velocity may be calculated, the look up table provides a fast and accurate method without tying up the microprocessor. Accumulator device 300 continues to send an interrupt to microprocessor 94 with every rising edge of the Doppler pulse. Although the microprocessor no longer reads accumulator device 300, with every interrupt it receives from accumulator device 300, microprocessor 94 continues to increment the Doppler count. The Doppler count represents the number of Doppler pulses received, each pulse being equivalent to 0.5 inches of relative movement by the object; each Doppler cycle is one half the wavelength of the 5.8 GHz carrier signal. Thus, once the intersection of the first and second Doppler is detected, giving an instantaneous range of the object, the object's range thereafter can be tracked by counting the Doppler pulses reflected from the object.

While the velocity is being determined, microprocessor 94, a portion of which is included in a collision decision device 228, continues to monitor the amplitude of the Doppler. When collision decision device 228 has determined that a collision is imminent, a fire signal along with the velocity information is sent to decision device 220 via signal path 204. In the preferred embodiment microprocessor 94, analog to digital converter 290, counter device 102 and accumulator device 300 are contained in a single chip, Model PIC16C74, available from Microchip of Chandler, Ariz.

Figure 11:
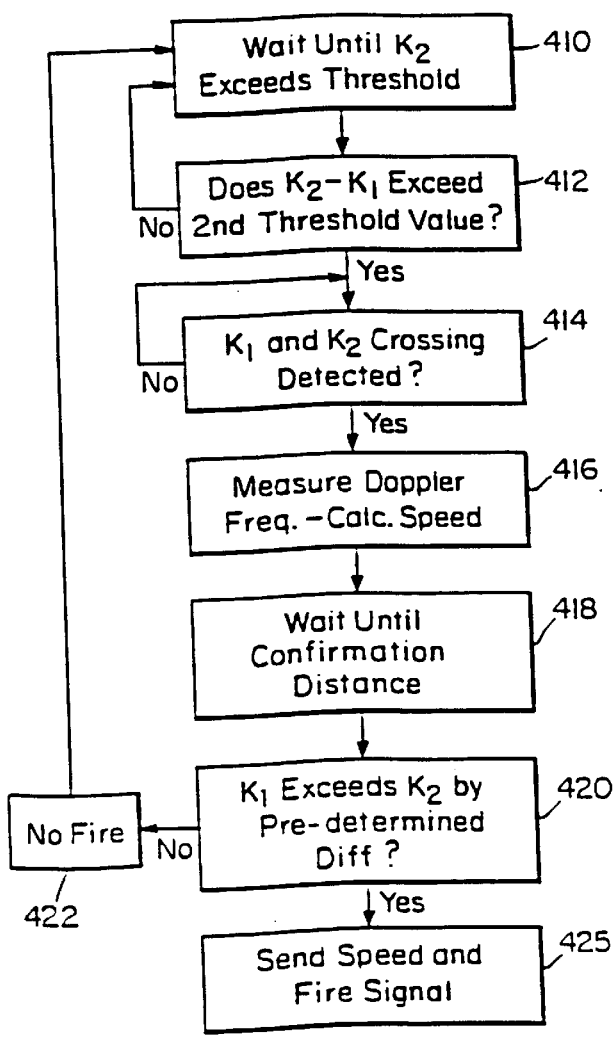
FIG. 11 is a flow chart of the routine used by the range determining device to monitor the first and second harmonic components of the received Doppler signal to determine that a collision is imminent.

The software implemented by microprocessor 94 to monitor the Doppler amplitudes of the harmonic components is illustrated by the flow chart of FIG. 11. In block 410 microprocessor 94, FIG. 9, monitors the amplitude of the second Doppler, K2, to determine when it exceeds a predetermined threshold value. Once this threshold value has been exceeded the microprocessor monitors the difference between K2 and the amplitude of the first Doppler, K1, to determine whether that difference exceeds a second threshold value, block 412. If that second threshold value is not exceeded, the software returns to block 410 continuing to monitor K2. However, if the difference between the two harmonic components exceeds the second threshold value, microprocessor 94, FIG. 9, monitors K2 and K1, to detect when K1 equals K2, block 414, at which point the instantaneous range of the object is known. If K1 equals K2, block 414, microprocessor 94 initializes velocity measurement device 226, FIG. 9, to measure the Doppler frequency and determine the instantaneous, relative velocity of the object, block 416. Once the velocity calculation has been initiated, block 416, the microprocessor waits for a confirmation distance, block 418. This confirmation distance is determined by counting the Doppler pulses, each pulse translating to 0.5 inches of relative movement, from the intersection of K1 and K2 where the range is known. Once that confirmation distance has been achieved, the K1 and K2 components are compared to determine whether the K1 component exceeds K2 by a predetermined difference, block 420, which difference represents the difference that would occur in an actual collision given the same velocity. If that difference is detected, a fire signal and velocity information are sent to decision device, block 425. If K1 does not exceed K2 by a predetermined difference, block 420, then no fire signal is sent, block 422, which indicates that no collision will occur, and the microprocessor returns to monitoring K2, block 410.

Figure 12:
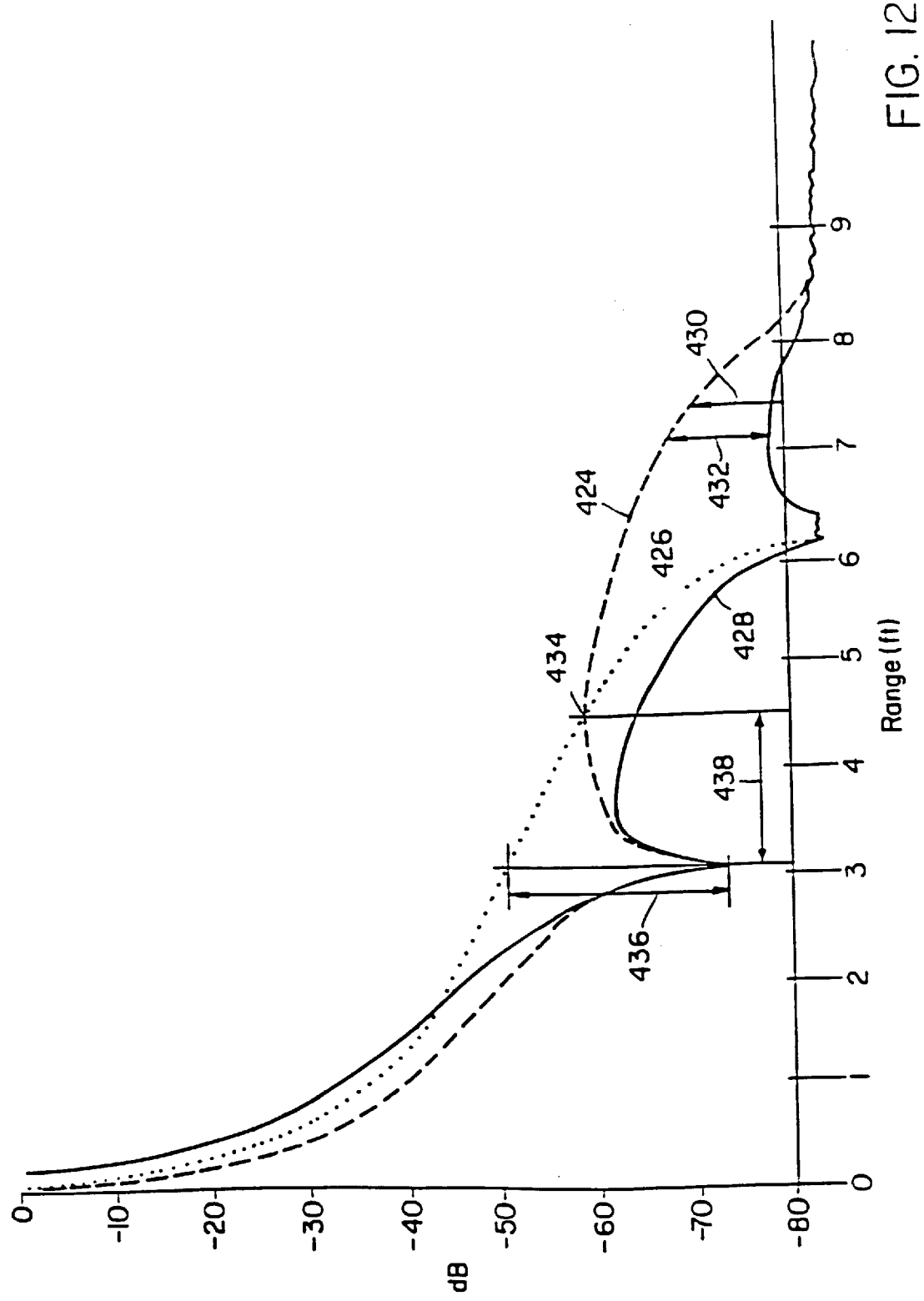
FIG. 12 is a graphic representation of the typical relative amplitudes of the Doppler harmonics of the received signal.

An example of the Doppler amplitudes microprocessor 94, FIG. 9, is looking for is illustrated in FIG. 12. When the amplitude of the second Doppler 424 exceeds a predetermined threshold value 430 the microprocessor monitors the difference between the amplitudes of the second Doppler 424 and the first Doppler 428 until there is detected a second threshold value 432, which represents the predetermined difference. Once this second threshold value 432 is detected, the microprocessor monitors the amplitude of the second Doppler 424 and the amplitude of the first Doppler 426 to detect when the amplitudes are equal. This is represented by crossing 434. Once crossing 434 has been detected, the microprocessor monitors the amplitude of the second Doppler 424 and the amplitude of the first Doppler 426 for a confirmation distance 438. This confirmation distance is generally equal to the distance from the sensor system to just beyond the edge of the automobile. Once the microprocessor has waited for the confirmation distance 438 it compares the amplitude of the second Doppler 424 with the amplitude of the first Doppler 426 looking for a predetermined difference 436 which represents the difference which would occur in an actual collision. When predetermined difference 436 has been detected at the confirmation distance 438, microprocessor 94, FIG. 9, determines that a collision is imminent and sends a fire signal to the decision device 220, FIG. 9.

It should be noted that amplification of the Doppler components can be used to vary their relationships with each other and thus shift crossing 434 to a desired distance as well as confirmation distance 438. This simple gain adjustment using amplifiers 258–262 provides a degree of freedom for various pre-crash sensing applications where a single sensor is mounted in the center of a bumper of the automobile. Because the typical width of an automobile is 4 to 5 feet, the decision must be made just beyond the edge of the automobile so as not to induce false alarms. Thus, the system can be easily adapted for any size automobile.

Figure 13A:
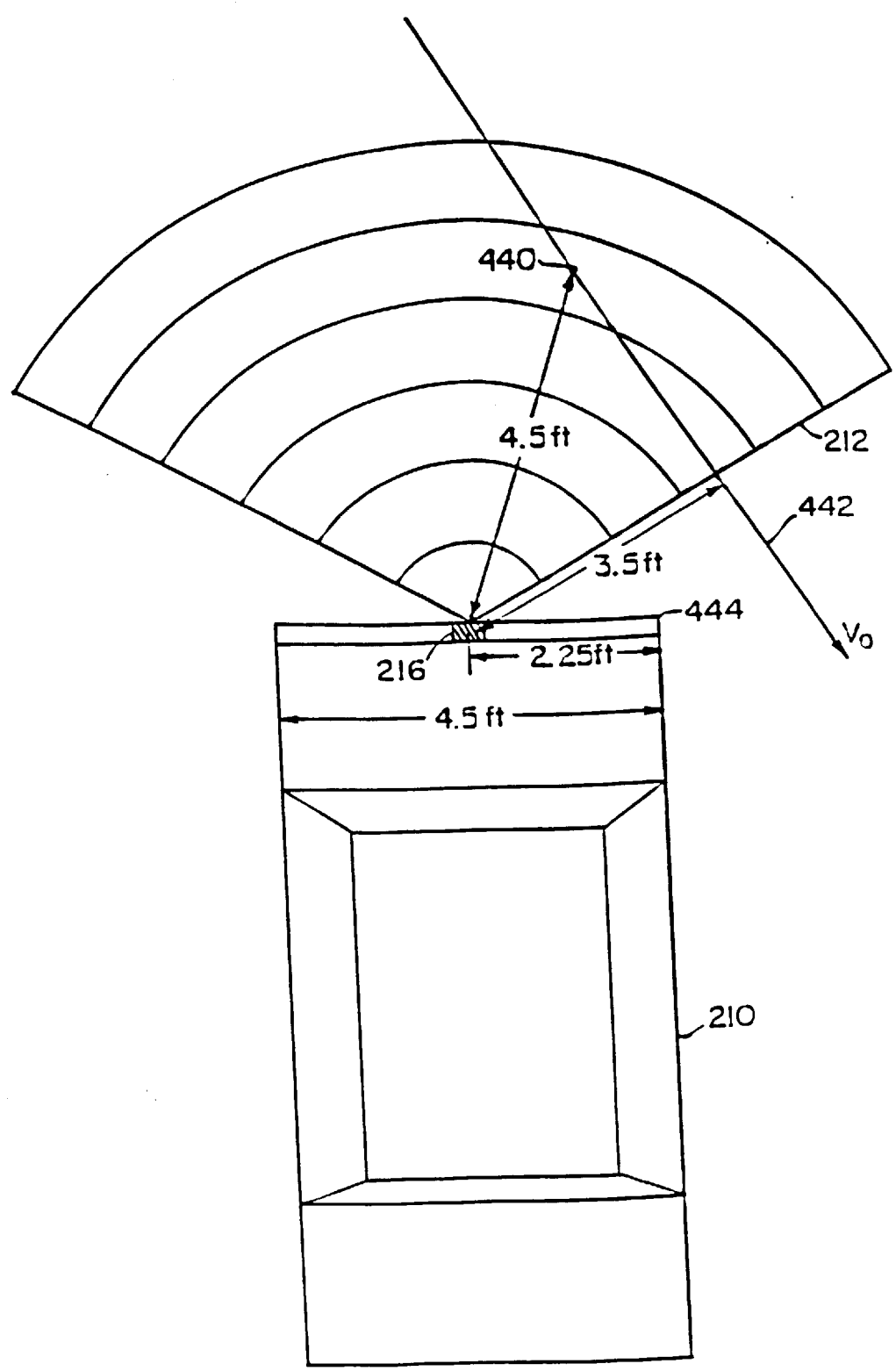
FIG. 13A illustrates an automobile on a potential collision course with an object wherein the automobile does not impact that object.
Figure 13B:
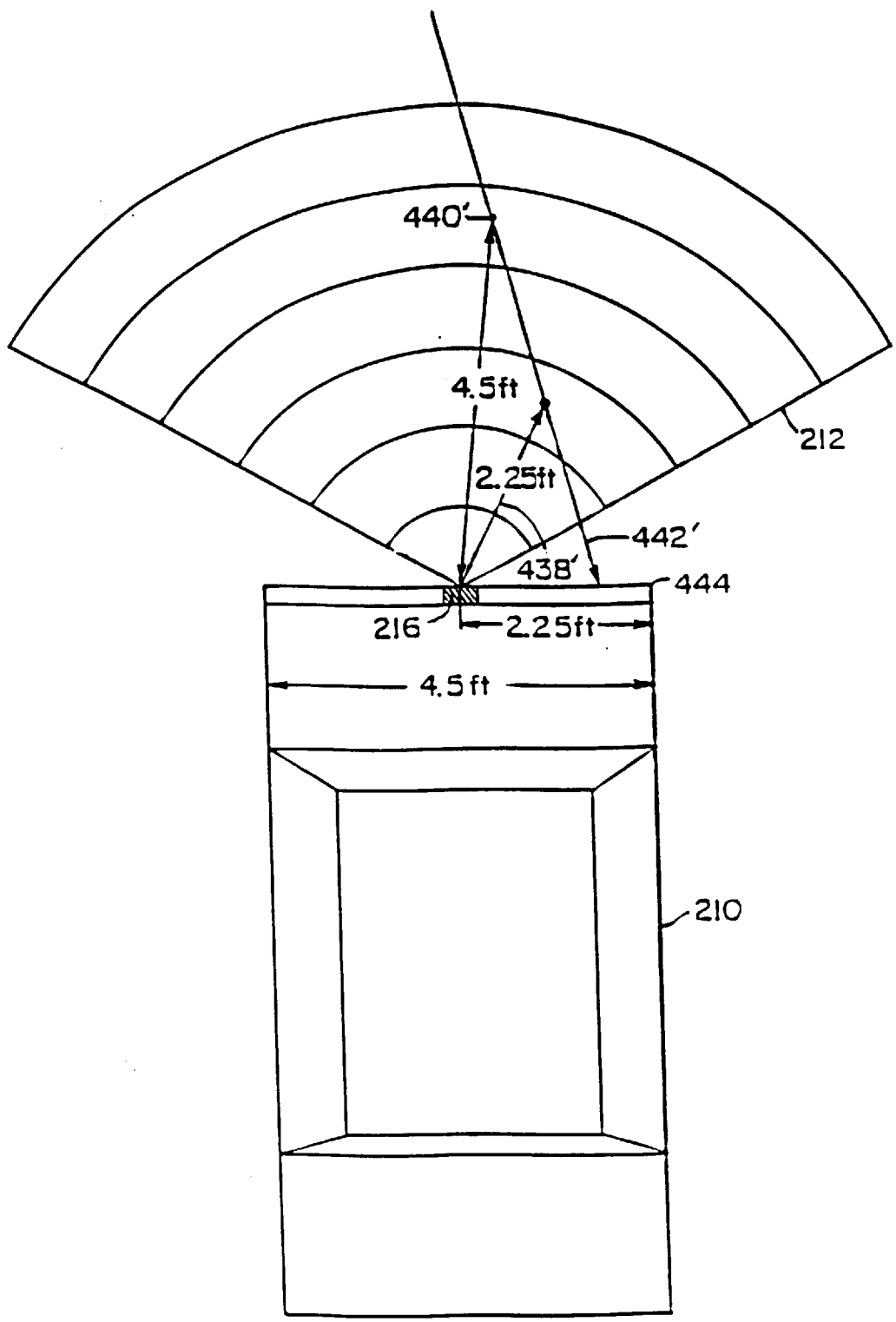
FIG. 13B is an illustration of an automobile on a potential collision course with an object, similar to FIG. 13A, wherein the automobile does impact the object.

The manner of detecting a collision or no collision condition can be understood more clearly with reference to FIGS. 13A and 13B. In FIG. 13A, there is an anticipatory collision sensor system 216 mounted in an automobile 210 producing a radar cone 212. An object 440 is detected at a distance 4.5 feet from the sensor system 216 and moving in a direction indicated by an arrow 442. The Doppler amplitudes of the harmonics of the signal reflected by object 440 are monitored by the microprocessor to determine when the amplitude of the second Doppler 424, FIG. 12, exceeds the threshold value 430, FIG. 12. Once that threshold value is exceeded the microprocessor continues to monitor the Doppler amplitudes of the harmonics, as discussed above. When crossing point 434, FIG. 12, has been detected, the instantaneous range of the object is 4.5 feet, as discussed in FIG. 8, and the microprocessor waits for a confirmation distance. The confirmation distance of FIG. 13A is 2.25 feet which is the distance from the anticipatory collision sensor system 216 to the edge of the bumper 444. As can be seen, the direction of movement 442 is such that object 440 will not intersect with the automobile 210. Thus, the Doppler amplitude of the harmonic components at the confirmation distance of 2.25 feet will not equal the amplitudes which would occur in an actual collision. Therefore, no collision is detected and the microprocessor returns to monitoring the amplitude of the second Doppler until it exceeds the predetermined threshold value, block 410 FIG. 11.

There is shown in FIG. 13B, the same automobile 210 of FIG. 13A and an object 440' moving in a direction indicated by arrow 442'. The Doppler amplitudes of the harmonic components of the reflected signal are monitored by the microprocessor to detect when the amplitude of the second Doppler exceeds a predetermined threshold value 430, FIG. 12. The Doppler amplitudes of the harmonic components continue to be monitored as discussed above. When crossing 434, FIG. 12, the object is detected at 4.5 ft. The microprocessor waits a confirmation distance 438' and compares the amplitude of the first Doppler 426, FIG. 12, to the amplitude of the second Doppler 424, FIG. 12, to determine if the amplitude of the first Doppler exceeds the amplitude of the second Doppler by predetermined difference 436, FIG. 12. When the microprocessor detects the predetermined difference it determines that a collision with the object is imminent and sends a fire signal and velocity information to the decision device, block 424, FIG. 11.

Figure 14:
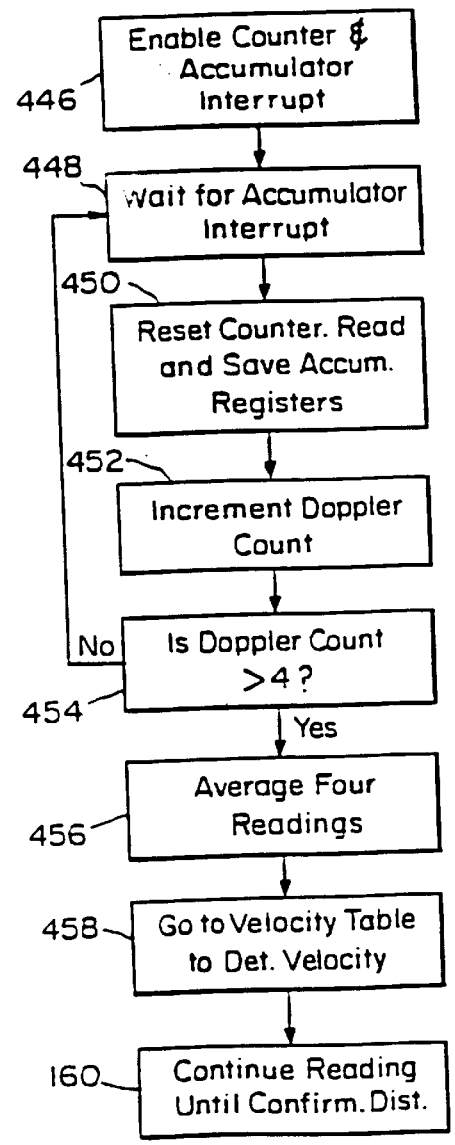
FIG. 14 is a flow chart of the velocity measurement steps taken by the range determining device in an anticipatory collision system.

The flow chart of the velocity measurement steps taken by velocity measurement device 226, FIG. 9, is shown in FIG. 14. Once crossing 434, FIG. 12, is detected, the counter device and accumulator device are enabled by the microprocessor, block 446. The microprocessor waits for an interrupt from the accumulator device, FIG. 9. When the interrupt is received, the microprocessor resets the counter device and reads and saves the clock cycle count stored in the accumulator device, block 450, adding it to the previous count. The microprocessor increments the Doppler count by 1, block 452, and compares the Doppler count to determine whether it is greater than 4, block 454. If the Doppler count does not exceed 4 the routine returns to block 448 to wait for the next interrupt. However, if the Doppler count is greater than 4, the microprocessor divides the total number of 5 MHz cycles by 4 to obtain an average clock cycle count over 4 readings of the 5 MHz clock, block 456. The microprocessor compares the average clock cycle count to a look up table to determine the relative velocity of the object, block 458. The microprocessor discontinues reading the accumulator device, but increments the Doppler count with each interrupt received from the accumulator counting Doppler pulses until the confirmation distance has been reached, block 460. At this point, it determines whether or not a collision is imminent and either a fire signal, along with the velocity information, will be sent to the decision device, block 425 FIG. 11, or a no fire signal will be sent, block 422 FIG. 11.

Figure 15:
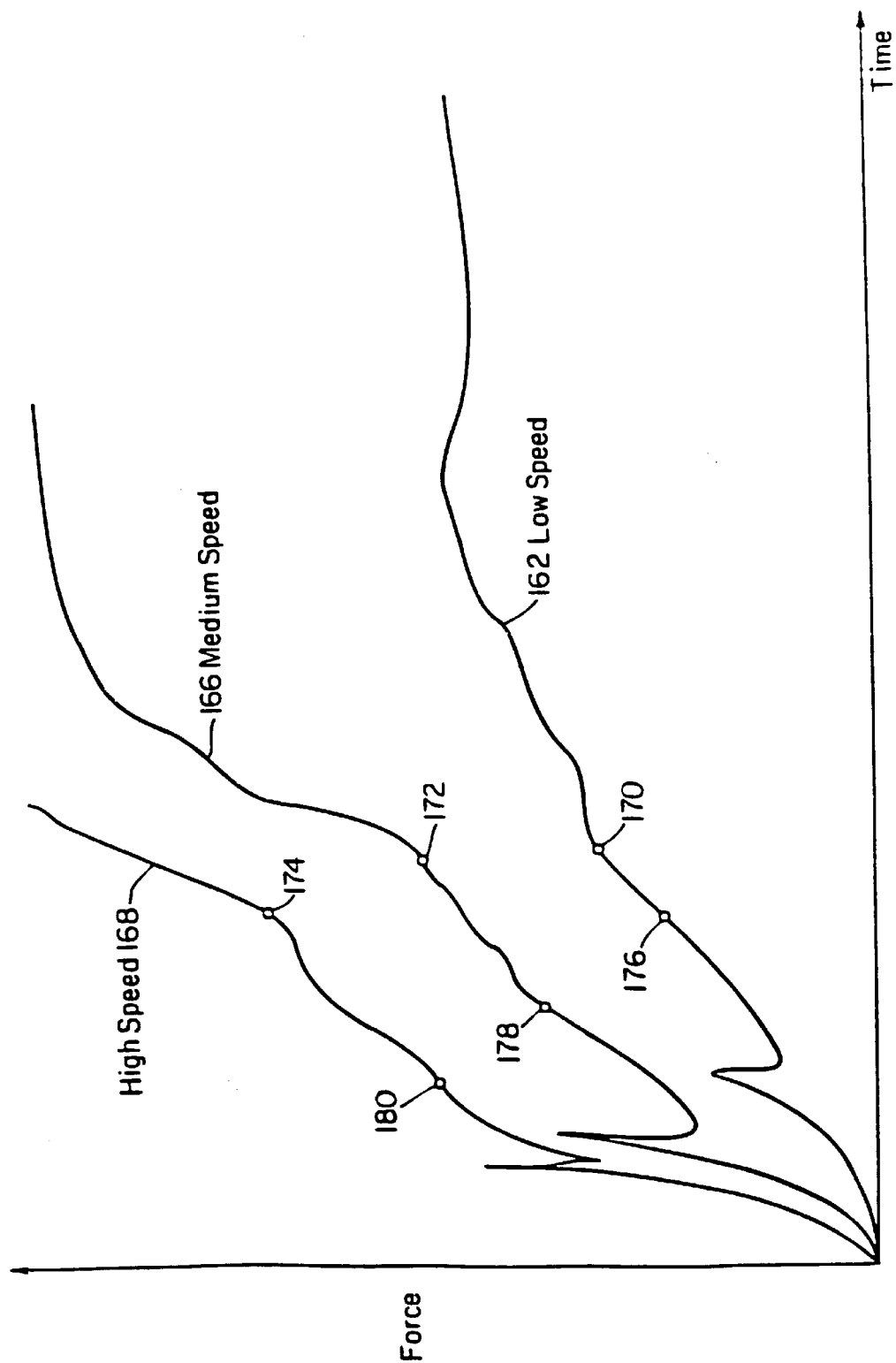
FIG. 15 is a graphic representation of g force sensor signals for low, medium and high speed collisions illustrating the various firing points of the passenger restraint system based on a detected relative velocity of an object compared to firing points based on an actual collision with the object.

A graphic representation of g force sensor signals for low speed 462, medium speed 466, and high speed 468 collisions based on empirical data of actual crashes can be seen in FIG. 15. Firing points 470, 472 and 474 correspond to typical points during a crash event at which the g sensor will send a fire signal to the passenger restraint system for low speed 462, medium speed 466, and high speed 468 collisions, respectively, based on the g forces the automobile is actually undergoing. In contrast, firing points 476, 478 and 480 represent the firing points for low speed 462, medium speed 466 and high speed 468 collisions as determined by the anticipatory collision sensor system according to this invention. For example, because a collision can be anticipated and determined to be imminent the passenger restraint system may fire at a point 476 which is much earlier in the crash event than the typical firing point 470 as determined by the g force sensor. In other words, whereas the g force sensor cannot determine the severity of the collision until a point in time 470 as a crash occurs, the anticipatory collision sensor system can determine the severity of the collision, based on the relative velocity of the object, at a point in time 476 before the collision takes place. This reduces the time to fully deploy the airbag, thereby allowing full deployment of the airbag before the occupants have shifted position due to the collision. This allows the passenger to remain at a safer distance from the airbag as it inflates. This also permits variable inflation rates of the airbag, while allowing it to inflate sufficiently in time to restrain the occupants. It should be noted that firing points 476, 478 and 480 are based on the relative velocity of the object and the distance of the object and are not arbitrary firing points.

Figure 16:
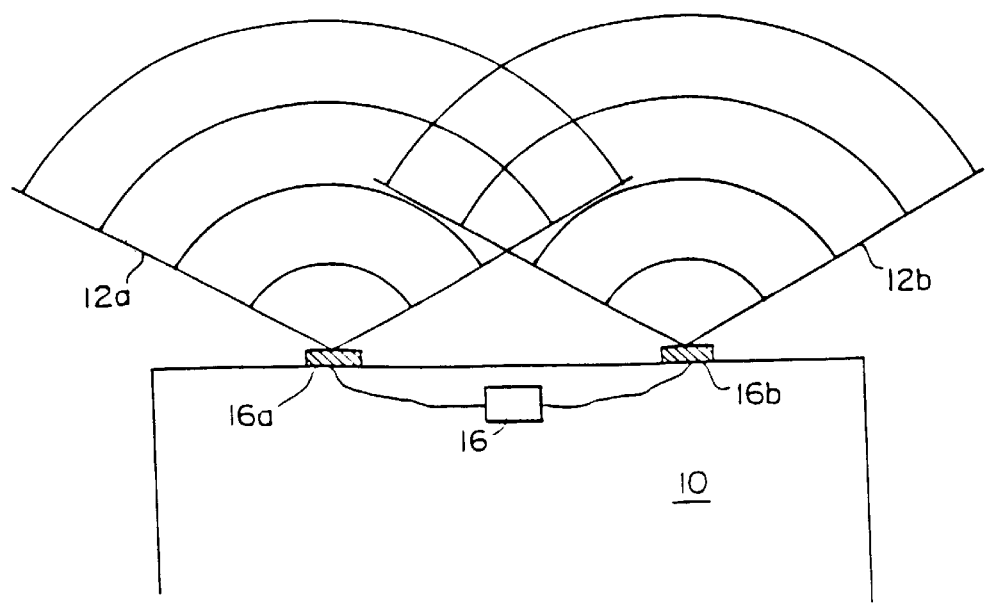
FIG. 16 is a top view of an automobile using an anticipatory collision sensor system having two sensors.

Referring to FIG. 16, there is shown an automobile 210 equipped with an anticipatory collision sensor system 16 having sensors 216A and 216B, which emit radar cones 212A and 212B respectively. The system operates in a manner similar to the single sensor system discussed above.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A dynamic, self adjusting synchronization system for real time control of the frequency of a modulated signal comprising:

a voltage controlled oscillator for generating a carrier signal of a predetermined frequency to be modulated;

a modulation generator for generating a modulation signal for modulating said carrier signal to produce a modulated carrier signal and a co-generated measurement signal synchronized with said modulation signal;

a measurement device including a counter device for counting the pulses of said modulated carrier signal for a predetermined period of time and including a measurement circuit responsive to said co-generated signal for defining the period of time during which said modulated carrier pulses are counted; and an adjustment device, responsive to said measurement device, for varying the voltage applied to said voltage controlled oscillator to maintain said predetermined frequency of said carrier signal.

2. The dynamic, self adjusting synchronization system of claim 1 in which said modulation generator includes counting means, responsive to a predetermined clock signal, for producing said synchronized co-generated measurement signal which is a sub-multiple of said clock signal.

3. The dynamic, self adjusting synchronization system of claim 2 in which said modulation generator further includes a digital to analog converter for generating said modulation signal.

4. The dynamic, self adjusting synchronization system of claim 3 in which said adjustment device includes a frequency control circuit for varying the voltage of said voltage controlled oscillator to change the frequency of said carrier signal.

5. The dynamic, self adjusting synchronization system of claim 4 further including prescaling means, responsive to said carrier signal, for converting said carrier signal to a lower frequency for said measurement device.

6. A dynamic, self adjusting synchronization system for real time control of the bandwidth of a modulated signal comprising:

a voltage controlled oscillator for generating a carrier signal to be modulated having a predetermined frequency and bandwidth;

a modulation generator for generating a modulation signal for modulating said carrier signal;

means for selectively inhibiting said modulation signal; and a measurement device including a counter device for counting the pulses of said carrier signal for a predetermined period of time while said modulation signal is inhibited and including a measurement circuit responsive to a measurement signal for defining said predetermined period of time during which said carrier pulses are counted;

an adjustment device being responsive to said measurement device for varying the voltage applied to said voltage controlled oscillator to maintain said predetermined bandwidth of said modulated carrier signal.

7. The dynamic, self adjusting synchronization system of claim 6 in which said adjustment device includes a voltage control device for controlling said voltage level at the input to said voltage controlled oscillator.

8. The dynamic, self adjusting synchronization system of claim 7 in which said adjustment device includes digital to analog converter means for operating said voltage control device.

9. The dynamic, self adjusting synchronization system of claim 8 in which said modulation generator includes a counter responsive to a predetermined clock signal for producing a number of synchronized signals which are sub-multiples of said clock signal.

10. The dynamic, self adjusting synchronization system of claim 9 in which said modulation generator further includes a digital to analog converter for generating said modulation signal.

11. The dynamic, self adjusting synchronization system of claim 10 in which said counter device includes counting means and said means for inhibiting includes means for clearing said counter.

12. The dynamic, self adjusting synchronization system of claim 11 in which said means for clearing reduces said modulation signal to a predetermined value.

13. The dynamic, self adjusting synchronization system of claim 12 in which said counter device is driven by a clock signal independent of said modulation generator for providing a period of time for which the cycles of said carrier signal are counted while said modulation generator is inhibited.

14. The dynamic, self adjusting synchronization system of claim 13 further including prescaling means, responsive to said carrier signal, for converting said carrier signal to a lower frequency for said measurement device.

15. A dynamic, self adjusting synchronization system for real time control of the frequency and bandwidth of a modulated signal comprising:

a voltage controlled oscillator for generating a carrier signal to be modulated having a predetermined frequency and bandwidth;

an adjustment device including a center frequency adjustment circuit for providing a voltage level to said voltage controlled oscillator;

a modulation generator for generating a modulation signal for modulating said carrier signal to produce a modulated carrier signal and a co-generated measurement signal synchronized with said modulation signal;

means for selectively inhibiting said modulation signal; and a measurement device including a counter device for selectively counting the pulses of said modulated carrier signal for a first predetermined period of time and counting the pulses of said carrier signal for a second predetermined period of time while said modulation signal is inhibited and including a measurement circuit responsive to said co-generated measurement signal for synchronously defining said first predetermined period of time during which said modulated carrier pulses are counted and responsive to a timing signal for defining said second predetermined period of time during which said modulation signal is inhibited for counting said carrier pulses;

said adjustment device being responsive to said measurement device, for varying the voltage applied to said voltage controlled oscillator to maintain said predetermined frequency of said carrier signal and being responsive to said measurement device for varying the voltage applied to said voltage controlled oscillator to maintain said predetermined bandwidth of said modulated carrier signal.

16. The dynamic, self adjusting synchronization system of claim 15 in which said modulation generator includes a counter, responsive to a predetermined clock signal, for producing the synchronized said co-generated measurement signal which is a sub-multiple of said clock signal.

17. The dynamic, self adjusting synchronization system of claim 16 in which said modulation generator further includes a digital to analog converter for generating said modulation signal.

18. The dynamic, self adjusting synchronization system of claim 17 in which said adjustment device includes a frequency control circuit for varying the voltage of said voltage controlled oscillator to change the frequency of said carrier signal.

19. The dynamic, self adjusting synchronization system of claim 15 in which said adjustment device includes a voltage control device for controlling said voltage level at the input to said voltage controlled oscillator.

20. The dynamic, self adjusting synchronization system of claim 19 in which said adjustment device includes digital to analog converter means for operating said voltage control device.

21. The dynamic, self adjusting synchronization system of claim 20 in which said counter is responsive to a predetermined clock signal for producing a number of synchronized signals which are sub-multiples of said clock signal.

22. The dynamic, self adjusting synchronization system of claim 21 in which said counter device includes counting means and said means for inhibiting includes means for clearing said counter.

23. The dynamic, self adjusting synchronization system of claim 22 in which said means for clearing reduces said modulation signal to zero.

24. The dynamic, self adjusting synchronization system of claim 23 in which said counting means is driven by a clock signal independent of said modulation generator for providing a period of time for which the cycles of said carrier signal are counted while said modulation generator is inhibited.

25. The dynamic, self adjusting synchronization system of claim 22 further including prescaling means, responsive to said carrier signal, for converting said carrier signal to a lower frequency for said measurement device.

* * * * *